Aug. 31, 1965 R. H. PARMENTER 3,204,115

FOUR-TERMINAL SOLID STATE SUPERCONDUCTIVE DEVICE
WITH CONTROL CURRENT FLOWING TRANSVERSE
TO CONTROLLED OUTPUT CURRENT

Filed July 31, 1961 2 Sheets-Sheet 1

INVENTOR.
ROBERT H. PARMENTER
BY
W.S. Hill
AGENT

INVENTOR.
ROBERT H. PARMENTER
BY
W.S. Hill
AGENT

3,204,115
FOUR-TERMINAL SOLID STATE SUPERCONDUCTIVE DEVICE WITH CONTROL CURRENT FLOWING TRANSVERSE TO CONTROLLED OUTPUT CURRENT

Robert H. Parmenter, Princeton, N.J., assignor to Radio Corporation of America, a corporation of Delaware Filed July 31, 1961, Ser. No. 128,248
2 Claims. (Cl. 307—88.5)

Figure 1:
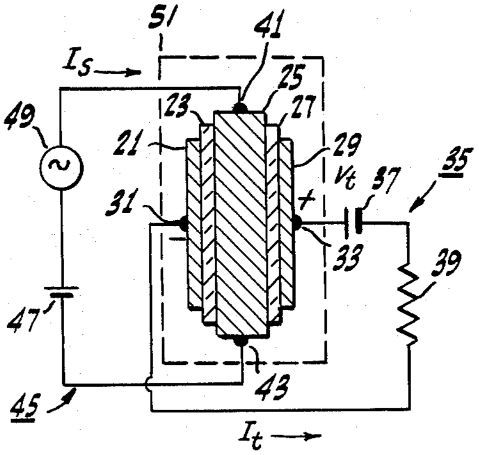

This invention relates to a novel solid state device which operates at temperatures near absolute zero. In particular, the invention relates to a four-terminal device which may be used as an active element in amplifying and switching operations in electric circuit.

Bodies of certain materials which are referred to as superconductors, exhibit two conditions of resistance to the flow of electric current through the body. These conditions are referred to as the normal condition and the superconducting condition. At or above a critical temperature $T_c$, a body of a superconductor is in the normal condition, whereby there is a resistance to the flow of electric current. Below the critical temperature, the body of the superconductor is in the superconducting condition whereby there is no resistance to the flow of electric current.

Bodies of other materials which are referred to as normal materials, exhibit a normal condition and do not exhibit a superconducting condition.

It is known that a body of a superconductor can be switched from the superconducting condition to the normal condition by applying thereto a sufficiently large magnetic field, or by raising the temperature of the body above its critical temperature $T_c$, or by passing therethrough a sufficiently large electric current equal to or greater than a current called the critical current. It is also known that certain metal-insulator-metal two-terminal structures at temperatures near absolute zero exhibit a non-linear resistance when one metal is superconducting, and a negative resistance when both metals are superconducting. See, for example, Physical Review Letters, 5, pages 147, 148, and 461 to 466. According to the theory set forth in these references, a superconductor has an energy band gap for normal charge carriers below its critical temperature $T_c$. This energy gap increases with decreasing temperature. Electrons having an energy lower than that of the energy gap are coupled to one another and are said to be superconducting electrons. At temperatures near absolute zero and below the critical temperature, there is also a small population of thermally-generated normal charge carries (electrons above the energy gap and holes below the energy gap). Normal charge carriers are not coupled to one another and can tunnel through a thin electrical insulator which contacts the superconductor. Superconducting charge carriers cannot tunnel through such an insulator.

It is an object of this invention to provide a novel solid state device which operates at temperatures near absolute zero.

A further object is to provide a four-terminal solid state device which may be used in active functions of amplifying or switching in electric circuits.

The device of the invention comprises a first region (or emitter) of a material selected from the group consisting or normal materials and superconductors, a second region (or base) of a superconductor spaced from the first region by a first thin electrically-insulating layer, and a third region (or collector) of a material selected from the group consisting of normal materials and superconductors spaced from the second region by a second thin electrically-insulating layer. The insulating layers have a thickness (transverse cross-sectional dimension) such that normal charge carriers can tunnel therethrough. The insulating layers are preferably 6 to 100 A.U. (Angstrom Units) thick. The regions are further related to one another in that the second region has a larger energy band gap than the energy band gaps of the first and third regions. The first and third regions preferably have substantially the same energy band gap or no energy band gap. Where the first and third regions are of normal materials, they do not exhibit energy band gaps and therefore satisfy the foregoing relationships. The devices of the invention are operated at temperatures at which the superconductor having the smallest energy band gap is superconducting.

In one mode of operation, all three regions are superconductors. A bias voltage $V_t$ is applied to the third region with respect to the first region, so that an output current $I_t$ of normal carriers flows along a path through the insulating layers and the base region and through an external load circuit connected to the first and third regions. Where the control current $I_s$ is zero, the $I_t$-$V_t$ curve includes a negative resistance region over a range of voltage. Increase flow of the control current $I_s$ has the effect of broadening the negative resistance region of the $I_t$-$V_t$ curve, and the negative resistance is controlled by the magnitude of the transverse control current. Thus, the device can be used as an amplifier or switch controlled by the transverse control current of superconducting carriers.

In a second mode of operation, the second region is superconducting and the first and third regions are either of superconductor or of normal materials. An output current $I_s$ of superconducting charge carriers is made to flow along a path in the second region longitudinally between the first and third regions and through an external load circuit. A control voltage $V_t$ is applied across the first and third regions so that normal electrons are injected from one of the regions into the second region and normal holes are injected from the other of the regions into the second region. This injection of normal charge carriers into the second region effectively lowers the transition temperature of the second region and quenches the superconductivity of the second region. Upon suitable adjustment of the control voltage $V_t$, the injection of normal charge carriers into the second region is stopped, injected carriers recombine in the second region, and the energy band gap is reestablished. Thus, the control voltage $V_t$ is used to establish or quench superconductivity in the second region, thereby controlling the amount of output current passing in the load circuit. The output current $I_s$ of superconducting carriers may be a replica of the injected current of normal carriers. Current gain is achieved because the output current in the load circuit is larger than the injected current in the control circuit.

Figure 3:
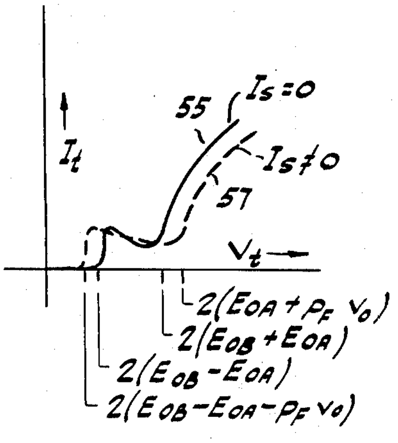
Figure 2A:
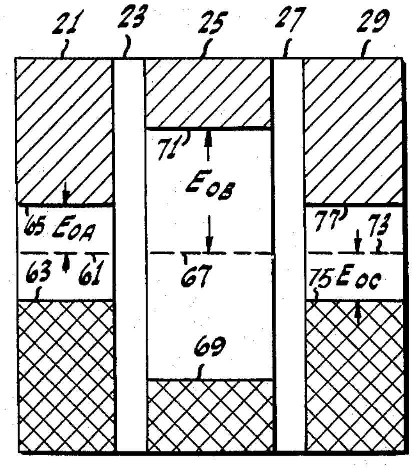
Figure 2B:
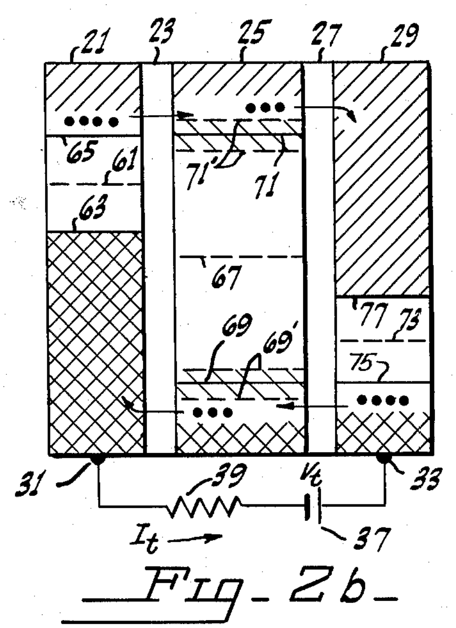
Figure 4:
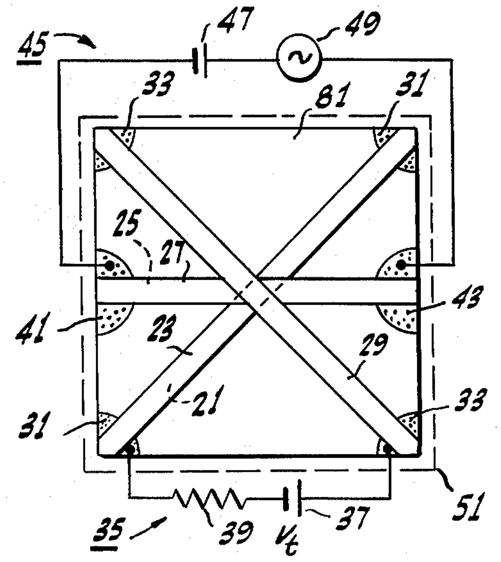
Figure 5:
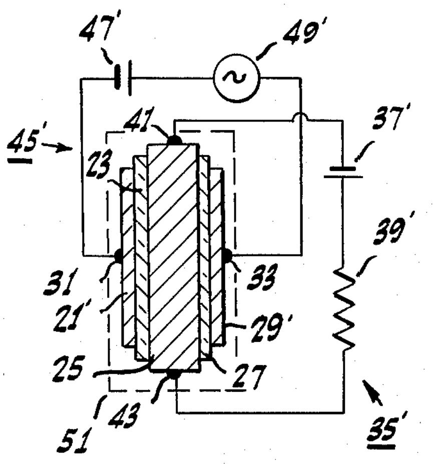
Figure 6:
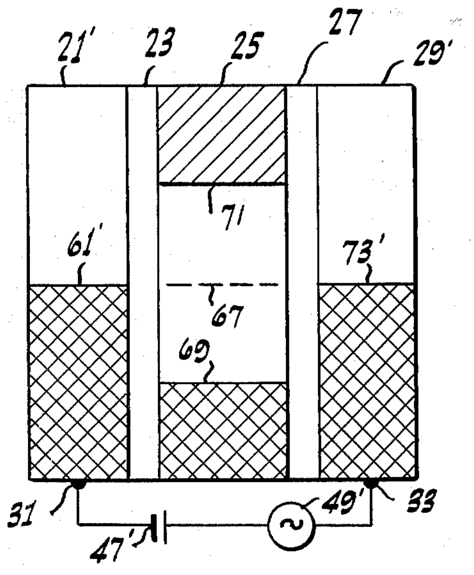

A more detailed description of several embodiments of the invention is set forth below in conjunction with the drawings in which:

FIGURE 1 is a partially schematic, partially sectional view of a first embodiment of the invention, FIGURES 2*a* and 2*b* are energy level diagrams to aid in understanding the first mode of operation of the device of FIGURE 1, FIGURE 3 is a group of I–V curves for the device of FIGURE 1 in the two conditions where no control current is flowing and where a control current is flowing, FIGURE 4 is a partially schematic, partially sectional view of a second embodiment of the invention, FIGURE 5 is a partially schematic, partially sectional view of a third embodiment of the invention, and, FIGURE 6 is an energy level diagram to aid in understanding the second mode of operation for the device of FIGURE 5.

Similar reference numerals are used for similar elements throughout the drawings.

A first embodiment of the invention, illustrated in FIGURE 1 comprises a plurality of adjacent layers in the following order: a first region or emitter 21, a first electrically-insulating layer 23, a second region or base 25, a second electrically-insulating layer 27 and a third region or collector 29. Each of the emitter 21, the base 25 and the collector 29 consists of a superconductor. A superconductor is characterized by exhibiting below a critical temperature $T_c$, an energy band gap about a Fermi level. This energy band gap increases with decreasing temperature until it reaches a maximum value of $2E_0$ at about absolute zero in temperature. Generally, the higher the critical temperature, the larger the maximum energy band gap. Some suitable superconductors and their calculated maximum energy band gaps and critical temperatures are listed in the table.

The emitter 21, the base 25 and the collector 29 are further related to one another in that the emitter 21 and the collector 29 are of superconductors that have the same or about the same energy band gap. The superconductor of the base 25 has a larger energy band gap than the superconductors of the emitter 21 and the collector 29. These are relative considerations so that any of the materials in Table 1 may be selected for any of the regions, provided the size of the energy band gap with respect to that of the other regions satisfies the relationship just described.

The first and second insulating layers 23 and 27 may be of aluminum oxide, such as is produced by oxidation of aluminum metal; or of silicon dioxide deposited from evaporated material; or of an organic material such as barium stearate or chromium stearate deposited by adsorption to the surface of one of the regions. The first and second insulating layers 23 and 27 should be thick enough to block superconducting charge carriers from passage therethrough, but thin enough to allow appreciable tunneling of normal charge carriers therethrough. Generally the insulating layers should be of substantially uniform thickness between 6 and 100 A.U. thick. The insulating layers 23 and 27 should also be free of pin holes and other discontinuities so that the passage of charge carriers therethrough is substantially uniform. The range of thickness between 10 and 30 A.U. is a reasonable choice of thickness. In the case of barium stearate, the layer is a monomolecular film about 40 to 60 A.U. thick.

The thicknesses of the emitter region 21 and the collector 29 may be 10,000 A.U. or any larger thickness which is convenient. The thickness of the base 25 between the emitter and collector should be less than a diffusion length for normal charge carriers. The thickness of the base should also be smaller than the London penetration depth (about 500 A.U.) in order that the transverse current density be roughly uniform across the thickness of the base. Base thicknesses between 50 and 200 A.U. have been found to be convenient. The device is symmetrical about the base and the functions of the emitter and collector are interchangeable. As illustrated in FIGURE 1, the emitter may also be referred to as the cathode or as the electron injector; and the collector 29 may also be referred to as the anode, or as the hole injector.

An emitter connection 31 and a collector connection 33 is made to the emitter 21 and to the collector 29 respectively. A pair of base connections 41 and 43 are made to the base 25. The base connections are along an axis and define the ends of a current path for superconducting charge carriers transverse to the thickness dimension of the base 25. The emitter 21 and the collector 29 define the ends of a current path for normal charge carriers through the insulating layers and through the base, which is transverse to the current path for superconducting charge carriers. The various connections 31, 33, 41 and 43 provide low resistance, non-rectifying contact to the respective regions which they contact.

A first battery 37 and a load 39 are connected in series to the emitter connection 31 and the collector connection 33 in a load circuit 35. A second battery 47 and a signal source 49 are connected in series to the pair of base connections 41 and 43 in a control circuit 45.

In operation, the device is placed in a cryostat 51 or other means for maintaining the device at temperatures close to absolute zero, and below the temperature at which the superconductor with the smallest energy band gap is superconducting. The critical temperature for the emitter 21 and the collector 29 should be slightly (10 to 30 percent) higher than the operating temperature of the device in order that there be appreciable numbers of normal charge carriers in the emitter and collector. The critical temperature of the base 25 should be sufficiently higher than the operating temperature in order that there be a negligible number of normal charge carriers in the base under thermal equilibrium. In FIGURE 1, the cryostat 51 maintains the device at the operating temperature below the critical temperature of the emitter 21 and collector 29. The cryostat 51 may comprise, for example, a thermally-insulating container and cooling means, such as a bath of liquid helium, and means for evaporating liquid helium in the region adjacent the device. The device is typically operated at or near the boiling point of liquid helium. A cryostat or other means 51 is used also in conjunction with the embodiments of FIGURES 4 and 5.

When the device is at its low operating temperature, the emitter 21, the base 25, and the collector 29 are superconducting. FIGURE 2*a* illustrates the relationships of the energy levels in the superconducting regions of the device with no bias applied. The Fermi level is shown by the dotted line 61 in the emitter, 67 in the base, and 73 in the collector, and extends at the same energy level throughout the device and in about the middle of each of the band gaps. The emitter 21 exhibits an energy band gap $2E_{oa}$ between the top 63 of a lower band and the bottom 65 of an upper band. The base 25 exhibits a larger energy band gap $2E_{ob}$ between the top 69 of a lower band and the bottom 71 of an upper band, which levels will be used as the reference levels in the description below of the operation of the device. The collector 29 exhibits an energy band gap $2E_{oc}$ between the top 75 of a lower band and the bottom 77 of an upper band. The values of $E_{oa}$ and $E_{oc}$ are substantially the same.

FIGURE 1 also illustrates the device in a circuit for a first mode of operation. The emitter 21 is biased negatively and the collector 29 is biased positively with respect to the base 25. As shown in FIGURE 2*b*, when the emitter 21 is biased negatively with respect to the base 25, the energy levels 63 and 65 move up with respect to the energy levels 69 and 71 in the base 25. When the collector 29 is biased positively with respect to the base 25, the energy levels 75 and 77 in the collector, move downward with respect to the energy levels 69 and 71 in the base. With the emitter 21 and the collector 29 biased as shown in FIGURE 2*b*, normal electrons are injected from the emitter 21 into the base 25 and are extracted or collected by the collector 29 from the base 25. Simultaneously, normal holes are injected from the collector 29 into the base 25 and are collected by the emitter 21 from the base 25. Both the injection of normal electrons and the extraction of normal holes take place by normal carriers tunneling through the first insulating layer 23. Both the injection of normal holes and extraction of normal electrons also take place by normal carrier tunneling through the second insulating layer 27. The total normal electron current and normal hole current is the load current $I_t$. The magnitude of the load current $I_t$ passed by the device is a function of the bias voltage $V_t$ as illustrated by the curve 55 of FIGURE 3. When the bias voltage $V_t$ is increased from zero, substantially no current is passed until the voltage reaches a value of $$2(E_{ob}-E_{oa})$$

above which normal electrons tunnel from the emitter to the base and normal holes tunnel from the collector to the base. In the BCS theory of superconductivity, the bottom of the conduction or upper band for normal electrons and the top of the valence or lower band for normal holes occurs everywhere on the Fermi sphere in momentum space, rather than at one or a finite number of points in momentum space, as in a semiconductor or insulator. As a result, there is an infinity in the density of allowed states for normal charge carriers at the band edges. When the bias voltage $V_t$ is made greater than $$2(E_{ob}-E_{oa})$$

there are fewer states in the base 25 to which the charge carriers at the opposite band edge can tunnel. Thus, the load current $I_t$ will then decrease with increasing bias voltage $V_t$, producing the characteristic negative resistance region. When the bias voltage is greater than $$2(E_{ob}+E_{oa})$$

holes can be injected into the lower allowed band of the emitter 21 and electrons can be injected into upper allowed band of the collector 29. The load current $I_t$ again increases with increasing voltage. The I–V curve has inverse symmetry about the origin (i.e. reversing the bias polarity reverses the current flow) because of the symmetry between electrons and holes.

When a control current $I_s$ of superconducting charge carriers is made to flow in the base 25 along a path between the base contacts 41 and 43 and transverse to the path of normal charge carriers in the base 25 between the emitter 21 and the collector 29, and through the external control circuit 45, the transverse superconducting control current $I_s$ has the effect of smearing out the infinity in the density of states at the band edges in the base 25. This smearing occurs over an energy range $p_f v_o$, where $p_f$ equals momentum at the Fermi level and $v_o$ equals the transverse superconducting electron drift velocity. The smearing is a consequence of the fact that the threshold bias for tunneling of normal carriers moving in a given direction is a function of this direction whenever there is a finite transverse superconducting current. This smearing out is illustrated in FIGURE 2*b* by the cross hatch area in the base 25 bounded by the lines 71′–71′ in the upper band and by the lines 69′–69′ in the lower band. As a result, the negative resistance region of the $I_t$–$V_t$ curve is broadened out as is illustrated by the broken curve 57 in FIGURE 3. Thus, the negative resistance region of the curve may be controlled by the transverse superconducting control current $I_s$. This effect is important for transverse superconducting currents smaller than the critical current for the base 25. This importance follows from the fact that the transverse control current $I_s$ will quench the superconductivity in the base when $v_o$ equals $E_{ob}/p_f$. The superconducting control current $I_s$ in the base should preferably be small enough to minimize the magnetic effects due to the current (i.e. magnetic coupling between the base 25 and the emitter 21, and the base 25 and the collector 29). This is preferably achieved by making the thickness of the base 25 comparable with or smaller than the London penetration depth (about 500 A.U.).

Any effects of magnetic field in the emitter 21 and collector 29 and their respective contacts 31 and 33 can be reduced by making the thicknesses of each of the emitter 21 and collector 29 greater than the Pippard coherence distance. For most superconductors this characteristic distance is of the order of 10,000 A.U. It is emphasized that it is the density of superconducting control current in the base 25 rather than the total superconducting current in the base 25 which controls the amount of normal carrier current in the base 25. Thus, by making the thickness of the base 25 smaller, the current gain of the device is increased.

Current gain is achieved in the device in that a relatively small superconducting current $I_s$ may be used to control a larger normal carrier current $I_t$. Power gain may be achieved in the device because in addition to current gain, there may be a higher impedance in the load circuit than there is in the control circuit.

FIGURE 4 inludes a plan view of a second embodiment of the invention. The second embodiment is in most respects similar in structure to the first embodiment and the same reference numerals are given to similar structures. The device of FIGURE 4 comprises an electrically insulating substrate 81 such as a borosilicate glass in the form of a square. Several pairs of electrode connections 31, 33, 41, 43 of platinum metal adhere to the substrate 81 over a small surface area near each edge of the substrate 81. Such connections may be prepared by painting the area with a platinum paint or a platinum resinate, and then heating the substrate 81 with the paint thereon to about 400° C. to volatilize the organic material and to adhere the platinum metal.

For this embodiment, an aluminum emitter 21 in the form of a stripe about 10 mils wide and about 10,000 A.U. thick extends between and over the electrode connections 31 which are at opposite corners of the substrate. Such an aluminum electrode may be produced by evaporating aluminum metal upon the substrate 81 which has been suitably masked. A first insulating layer 23 is located over and in contact with the emitter electrode 21. The first insulating layer 23 is produced by oxidizing the surface of the aluminum of the emitter 21 as by exposure of the metal to air. The oxidized portion is a layer of aluminum oxide about 20 to 40 A.U. thick. The insulating layer 23 is an electrical insulator through which normal electrical charge carriers can tunnel but which blocks the passage of superconducting carriers. The insulating layer 23 may also be produced by chemical or electrolytic oxidation of the emitter material where the chemistry allows of this. Alternatively, the first insulating layer 23 may be produced by the evaporation of SiO or $SiO_2$.

A lead metal base 25 in the form of a stripe about 15 mils wide and about 50 A.U. thick, extends between and over the base connections 41 and 43. The stripe 25 crosses over and contacts the insulating layer 23. Such a lead electrode may be produced by evaporating lead metal upon the substrate 81 which has been suitably masked. An insulating layer 27 is located over and in contact with the base 25. In this embodiment, the second insulating layer 27 is produced by oxidizing the surface of the lead of the base 25 to lead oxide, as by chemical oxidation. The oxidized portion of the second insulating layer consists essentially of lead oxide about 20 to 40 A.U. thick.

An aluminum metal collector electrode 29 in the form of a stripe about 10 mils wide and about 10,000 A.U. thick extends between and over the electrode connections 33. The electrode stripe 29 crosses over and contacts the insulating layer 27. The collector 29 may be produced by the same techniques as the emitter 21, as by evaporating aluminum metal over the previous layers and the substrate 81, which have been suitably masked. The base 25 overlies the emitter 21, and the collector 29 overlies the base 25 in a common region near the center of the substrate 81.

The embodiment of FIGURE 4 is connected into the same load circuit and control circuit as in the first embodiment, with identical connections to emitter, base and collector, as indicated, taken from the electrode connections 31, 33, 41, 43. The second embodiment, as illustrated in FIGURE 4, may be operated by the first mode of operation as described for the first embodiment.

FIGURE 5 illustrates a third embodiment of the invention which may be operated in a second mode of operation. The above described first and second embodiments may also be operated by the second mode of operation. The second mode of operation contemplates a load circuit connected across the base connections 41, 43 and a control circuit connected across the emitter and collector connections 31 and 33 which are operated to inject larger densities of normal carriers into the base 21 to quench the superconductivity in the base.

The device illustrated in FIGURE 5 is identical with the device of FIGURE 1 except that the emitter 21' is of a normal material and the collector 29' is of a normal material. The energy relationships of the various regions of the device are illustrated in FIGURE 6. The relationships illustrated in FIGURE 6 are identical with the relationships illustrated in FIGURE 2*a* except that the emitter region 21' and the collector 29' have no energy band gaps, since they are of normal materials. Instead, the emitter 21' and the collector 29' each exhibit a Fermi level 61' and 73' (FIGURE 6) respectively indicating the energy level at which the probability of a free charge carrier existing is one-half.

FIGURE 5 also illustrates a load circuit 35' including a source of bias voltage 37' and a load 39' connected in series is connected across the base connections 41 and 43. A control circuit 45' comprising a source of bias voltage 47' and signal voltage 49' connected in series, is connected across the emitter connection 31 and the collector connection 33. In operation with no bias or signal applied across the emitter and collector connections 31 and 33, there is a superconducting current flowing through the base 25. When a signal from the source 49', with suitable bias from the battery 47' is applied across the emitter and collector connections 31 and 33, normal electrons are injected from the emitter 21' into the base 25 and normal holes are injected from the collector 29' into the base 25. As the concentration of injected holes and electrons increases, the energy band gap in the base 25 shrinks causing more normal carriers to be injected. Above a threshold voltage, a sufficient density of normal carriers is injected into the base to switch the base 25 to the normal condition. When the base 25 is switched to the normal condition, an additional impedance is placed in the load circuit thereby reducing the current in the load circuit. When the injection of normal electrons and holes is reduced, as by reducing the control voltage, the base 25 again reverts to the superconducting condition. Thus, the control voltage is used to control the amount of current passing in the load circuit.

*Table*

| Superconductor | Tc, °K. | Energy Gap(T=0)[1] (millivolts) |
|---|---|---|
| Technetium (Tc) | 11.2 | 3.4 |
| Niobium (Nb) | 8.7 | 2.6 |
| Lead (Pb) | 7.2 | 2.7 |
| Lanthanum (La) | 5.4 | 1.6 |
| Vanadium (V) | 4.9 | 1.5 |
| Tantalum (Ta) | 4.4 | 1.3 |
| Mercury (Hg) | 4.2 | 1.3 |
| Tin (Sn) | 3.7 | 1.1 |
| Indium (In) | 3.4 | 1.1 |
| Thallium (Tl) | 2.4 | 0.7 |
| Rhenium (Re) | 1.7 | 0.5 |
| Thorium (Th) | 1.4 | 0.4 |
| Aluminum (Al) | 1.2 | 0.3 |
| Gallium (Ga) | 1.1 | 0.3 |
| Zinc (Zn) | 0.9 | 0.3 |
| Uranium (U) | 0.8 | 0.2 |
| Osmium (Os) | 0.7 | 0.2 |
| Zirconium (Zr) | 0.6 | 0.2 |
| Cadmium (Cd) | 0.6 | 0.2 |
| Ruthenium (Ru) | 0.5 | 0.1 |
| Titanium (Ti) | 0.4 | 0.1 |
| Hafnium (Hf) | 0.4 | 0.1 |

[1] (Energy gap at T=0 measured by Tunneling in Pb, Sn, In, and Al. For other metals, it is assumed to be 3.5 $kT_c$, where $k$=0.086 millivolts/degree=Boltzmann's constant.)

In the claims:

1. An electronic device comprising a base of a superconductor, an emitter selected from the group consisting of normal materials and superconductors having an energy gap smaller than the energy band gap of said base and spaced from said base by a first thin electrically-insulating layer having a thickness in the range of between 6 and 100 Angstrom Units, a collector selected from the group consisting of normal materials and superconductors having an energy band gap smaller than the energy band gap of said base and spaced from said base by a second thin electrically-insulating layer having a thickness in the range between 6 and 100 Angstrom Units, said emitter and collector defining the ends of a current path of normal charge carriers through said base and said layers, the thickness of said base between said layers being in the range between 50 and 200 Angstrom Units, and a pair of low resistance connections to said base defining the ends of a current path of superconducting charge carriers through said base a bias means, a signal means, said bias means and said signal means being connected in series across said emitter and said collector, and a bias voltage source and a load connected in series across said low resistance connections.

2. An electronic device comprising a base of a superconductor, an emitter of a superconductor having an energy gap smaller than the energy band gap of said base and spaced from said base by a first thin electrically-insulated layer having a thickness in the range between 6 and 100 Angstrom Units, a collector of a superconductor having an energy band gap smaller than the energy band gap of said base and spaced from said base by a second thin electrically-insulating layer having a thickness in the range between 6 and 100 Angstrom Units, said emitter and collector defining the ends of a current path of normal charge carriers through said base and said layers, the thickness of said base between said layers being in the range between 50 and 200 Angstrom Units, a pair of low resistance connections to said base defining the ends of a current path of superconducting charge carriers through said base, said current path of superconducting charge carriers being transverse to and intersecting said current path of normal charge carriers a bias means, a signal means, said bias means and said signal means being connected in series across said emitter and said collector, and a bias voltage source and a load connected in series across said low resistance connections and means for maintaining said device at temperatures at which said base is superconducting.

References Cited by the Examiner

UNITED STATES PATENTS

| | | | |
|---|---|---|---|
| 2,944,211 | 7/60 | Richards | 307—88.5 |
| 2,989,714 | 6/61 | Park et al. | 307—88.5 |
| 3,116,427 | 12/63 | Giaever | 307—88.5 |

OTHER REFERENCES

"Superconducting Tunneling Devices," I. Giaever, Feb. 15, 1961, 1961 International Solid-State Circuits Conference.

IBM Technical Disclosure Bulletin, April 1961, "Laminar Cryotronic Structures," vol. 3, No. 11.

Article in Proceedings of the IRE, September 1960, Part II, "Cryotron Characteristics and Circuit Applications," A. E. Slade, pages 1569–1576.

ARTHUR GAUSS, *Primary Examiner.*

JOHN W. HUCKERT, *Examiner.*